United States Patent [19]
Cote et al.

[11] Patent Number: 5,217,567
[45] Date of Patent: Jun. 8, 1993

[54] SELECTIVE ETCHING PROCESS FOR BORON NITRIDE FILMS

[75] Inventors: Donna R. Cote, Poughquag, N.Y.; David M. Dobuzinsky, Essex Junction; Son V. Nguyen, Williston, both of Vt.

[73] Assignee: International Business Machines Corporation, Armonk, N.Y.

[21] Appl. No.: 842,663

[22] Filed: Feb. 27, 1992

[51] Int. Cl.$^5$ .................................. H01L 21/00
[52] U.S. Cl. .................................. 156/643; 156/654; 156/657; 437/236
[58] Field of Search ............. 156/643, 654, 657; 437/236

[56] References Cited

U.S. PATENT DOCUMENTS

| | | | |
|---|---|---|---|
| 4,137,141 | 1/1979 | Henry et al. | 204/192 |
| 4,181,564 | 1/1980 | Fogarty et al. | 156/643 |
| 4,226,665 | 10/1980 | Mogab | 156/643 |
| 4,303,467 | 12/1981 | Scornavacca et al. | 156/643 |
| 4,374,698 | 2/1983 | Sanders et al. | 156/643 |
| 4,493,855 | 1/1985 | Sachdev et al. | 427/41 |
| 4,793,897 | 12/1988 | Dunfield et al. | 156/643 |
| 4,814,041 | 3/1989 | Auda | 156/643 |
| 4,902,635 | 2/1990 | Imamura et al. | 437/236 |
| 5,066,533 | 11/1991 | America et al. | 156/657 |

OTHER PUBLICATIONS

Arya, et al., "Preparation, Properties And Applications Of Boron Nitride Thin Films," Thin Solid Films, 157 (1988) pp. 267-282.

Yamada, et al., "Improvements of Stress Controllability And Radiation Resistance By Adding Carbon To Boron-Nitride", J. Electrochem. So., vol. 137, No. 7 (Jul. 1990) pp. 2242-2246.

Maeda, et al., "Low Dielectric Constant Amorphous SiBN Ternary Films Prepared By Plasma-Enhanced Deposition", Jap. J. of Applied Physics, vol. 26, No. 5, (May 1987), pp. 660-665.

Maeda, et al., "A Low-Permittivity Interconnection Using An SiBN Interlayer", IEEE Transactions On Electron Devices, vol. 36, No. 9 (Sep. 1989), pp. 1610-1614.

Yuzuriha, et al., "Structural And Optical Properties Of Plasma-Deposited Boron Ni-ride Films", Thin Solid Films, 140 (1986), pp. 199-207.

Primary Examiner—Brian E. Hearn
Assistant Examiner—Laura M. Holtzman
Attorney, Agent, or Firm—William D. Sabo

[57] ABSTRACT

Disclosed is a process for etching a film of boron nitride with high selectivity to a layer of silicon dioxide or silicon nitride. The process involves exposing the film to a plasma formed from a mixture of an oxygen-containing gas, such as oxygen, and a small amount of a fluorine-containing gas, such as $CF_4$. The process provides a high etch rate and anisotropic profiles, as well as good uniformity.

15 Claims, 3 Drawing Sheets

SELECTIVE ETCHING PROCESS FOR BORON NITRIDE FILMS

BACKGROUND OF THE INVENTION

1. Field of the Invention

The present invention relates to a process for etching a film of boron nitride with high selectivity to a layer of silicon dioxide or silicon nitride.

2. Description of the Prior Art

In recent years, silicon nitride films have been increasingly used as interlevel dielectrics in the fabrication of ULSI devices. Silicon nitride films have found favor because they provide various advantages, such as good insulation characteristics, low deposition temperature and high passivation effect against moisture and alkali metal ions, as well as satisfactory conformal step coverage, crack resistance, etc. However, the dielectric constant of silicon nitride is relatively high, and this causes relatively large parasitic capacitance and relatively long propagation delay times between devices. In order to reduce the wiring capacitance, a dielectric material having a low dielectric constant is required; this material should also provide the other advantages provided by silicon nitride films.

One approach to solving the above problem is to use silicon dioxide as an interlevel dielectric. While silicon nitride has a dielectric constant of 7, silicon dioxide has a dielectric constant of 4. Recently, however, it has also been demonstrated that boron nitride films, that are boron-rich and prepared by thermal CVD (1000° C.), have a low dielectric constant of less than 4, with satisfactory insulation and thermal stability characteristics. For a review of various techniques for preparation of boron nitride films, see Arya, et al., "Preparation, Properties And Applications Of Boron Nitride Thin Films," *Thin Solid Films*, 157 (1988), pp. 267-282.

Boron nitride films having a low dielectric constant have also been prepared by introduction of a small amount of carbon or silicon. For example, in Yamada, et al., "Improvements Of Stress Controllability And Radiation Resistance By Adding Carbon To Boron-Nitride", *J. Electrochem. Soc.*, Vol. 137, No. 7 (Jul. 1990), pp. 2242-2246, a conventional plasma-enhanced CVD system, using a gas mixture of diborane, ammonia and methane, was employed to deposit carbon-containing boron nitride films (400°-500° C.). In Maeda, et al., "Low Dielectric Constant Amorphous SiBN Ternary Films Prepared By Plasma-Enhanced Deposition", *Jap. J. of Applied Physics*, Vol. 26, No. 5 (May 1987), pp. 660-665, silicon-containing boron nitride films were deposited by conventional plasma-enhanced CVD using a diborane, ammonia and silane gas mixture.

In the fabrication of ULSI devices, interlevel boron nitride films are etched to form contact vias. A number of techniques are disclosed in the art for etching boron nitride films. For example, U.S. Pat. No. 4,226,665, issued Oct. 7, 1980 to Mogab, describes the use of a plasma formed from $CF_4$, with a small amount of oxygen (8%), to etch boron nitride and silicon nitride films. Also Maeda et al., "A Low-Permittivity Interconnection Using An SiBN Interlayer", *IEEE Transactions On Electron Devices*, Vol. 36, No. 9 (Sep. 1989), pp. 1610-1614, show the use of oxygen or a $CF_4/H_2$ mixture to etch a SiBN layer, overlying a metallization pattern (Al-Si).

During etching of the films, it is also desirable that the overlying mask be replicated in the boron nitride without dimensional loss, i.e. that the etch be anisotropic. Further, it is important that there be minimal etching of the mask, typically silicon nitride or silicon dioxide, i.e. that the etch be highly selective to the overlying mask. Selectivity to silicon nitride and silicon dioxide is also required in that the boron nitride film frequently overlies a layer of one of these materials.

Processes which selectively etch to overlying or underlying layers of silicon dioxide have been developed, for use where silicon nitride is the interlevel dielectric material. See, for example, U.S. Pat. No. 4,793,897, issued Dec. 27, 1988 to Dunfield, et al., which discloses a process for etching silicon nitride selectively to underlying silicon dioxide, by employing a gaseous mixture of a fluorine-containing gas, e.g. $SiF_4$, and oxygen; the mixture contains a predominant amount of the fluorine-containing component. Such a process is also disclosed in U.S. Pat. No. 4,303,467, issued Dec. 1, 1981 to Scornavacca, et al., which discloses a plasma treatment with $SiF_4$.

Other processes for etching silicon nitride or silicon dioxide are disclosed in U.S. Pat. No. 4,374,698, issued Feb. 22, 1983 to Sanders, et al. (etching of silicon nitride or silicon dioxide, by employing a mixture of $CF_4$ and small amounts of oxygen and a halogen-containing compound, e.g. $CF_2Cl_2$); and U.S. Pat. No. 4,814,041, issued Mar. 21, 1989 to Auda (etching of silicon dioxide with a fluorine-containing gas, e.g. $CF_4$, and a small amount of oxygen).

Thus, there is a need in the art for a process for etching a film of boron nitride with high selectivity to a layer of silicon dioxide or silicon nitride, and which achieves anisotropic etch profiles, with reasonably high etch rates.

SUMMARY OF THE INVENTION

It is against this background that the present invention presents an improved process for etching a film of boron nitride. In accordance with the process, the film is exposed to a plasma formed from a mixture of an oxygen-containing gas and a small amount of a fluorine-containing gas, and it is etched with a high selectivity to a layer of silicon dioxide or silicon nitride. In practice, etch selectivities to silicon dioxide or silicon nitride, ranging generally from about 10/1 to about 30/1, can be achieved. In addition, the film of boron nitride is etched at highly satisfactory etch rates, which are not significantly depressed when the films are doped with carbon or silicon. And, the etch provides anisotropic profiles, and is suitable for use in a wide range of processes for etching boron nitride in a controlled manner.

Accordingly, in a preferred embodiment, the invention also provides an improved process for fabricating a semiconductor device, in which a film of boron nitride is formed on a processed semiconductor substrate, and a masking layer of silicon dioxide or silicon nitride is formed on the film. The substrate is exposed to a plasma formed from a mixture of an oxygen-containing gas and a small amount of a fluorine-containing gas, so as to etch the film at a higher rate than the masking layer, the exposing being terminated when a predetermined portion of the film has been removed.

BRIEF DESCRIPTION OF THE DRAWINGS

In the description to follow, reference will be made to the accompanying drawings.

DETAILED DESCRIPTION

Figure 1:
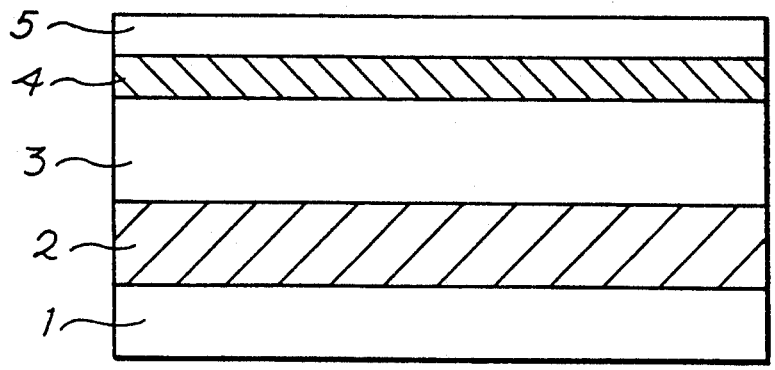
FIGS. 1-3 diagrammatically show successive stages of manufacture of a semiconductor device, using the etching process of the present invention.
Figure 2:
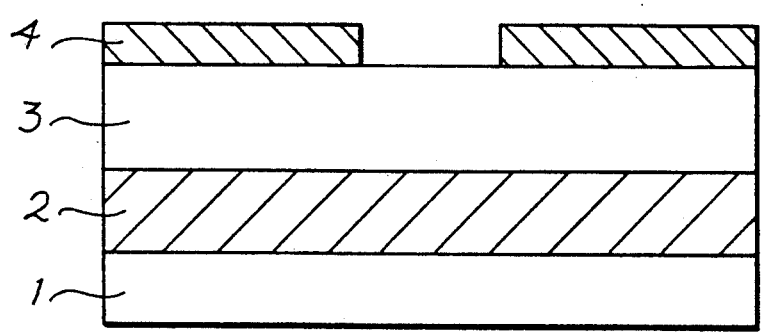
Figure 3:
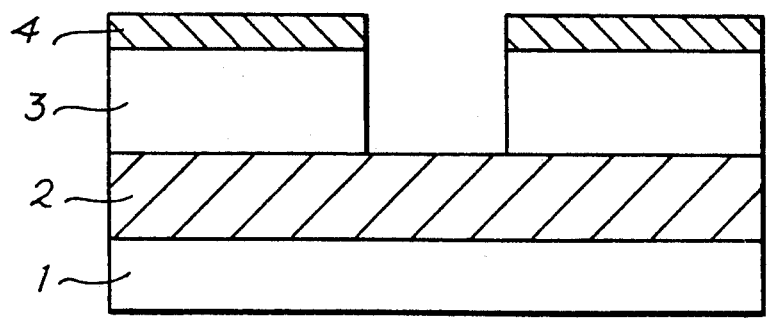

Referring to FIGS. 1-3, the etching process of the invention is illustrated by showing various stages in the fabrication of a semiconductor device. As shown in FIG. 1, a layer 2 is formed on a processed semiconductor substrate 1. Generally, the substrate 1, while for ease of illustration is shown as featureless, may actually include transistors, capacitors and other integrated circuit elements, as is well known to those skilled in the art. The layer 2 is typically a dielectric, such as silicon dioxide, silicon nitride, a spun-on glass (e.g. borophosphosilicate glass or phosphosilicate glass), a polymer (e.g. polyimide), or aluminum oxide, but may also be a wide variety of other materials, such as metals, and so forth.

Next, a film of boron nitride 3 is applied to the layer 2. Preferably, the film 3 is deposited by plasma enhanced chemical vapor deposition by reacting diborane ($B_2H_6$) with ammonia in a carrier gas, e.g. nitrogen, employing a relatively high ammonia/diborane ratio of greater than about 5/1, and more preferably, greater than about 7/1, and a temperature of about 400° C. However, a wide variety of preparation techniques, such as disclosed in Arya, et al., "Preparation, Properties And Applications Of Boron Nitride Thin Films", *Thin Solid Films,* 157 (1988), pp. 267-282; and in Yuzuriha, et al., "Structural And Optical Properties Of Plasma-Deposited Boron Nitride Films", *Thin Solid Films,* 140 (1986), pp. 199-207, may be employed as should be apparent to those skilled in the art. Further, the film 3 may also contain a dopant, such as silicon or carbon; such films are also known to those skilled in the art as described above. Typically, the films 3, which contain silicon or carbon, are formed by plasma-enhanced chemical vapor deposition, by adding silane or methane to the ammonia/diborane reaction mixture.

A masking structure is then formed on the boron nitride film 3. Still referring to FIG. 1, the masking structure preferably includes a lower layer 4 of silicon dioxide or silicon nitride, and an upper layer 5 of conventional photoresist. After the photoresist is exposed and developed using conventional photolithographic techniques, the underlying layer 4 is etched to form a desired pattern. Typically, the layer 4 is etched by exposure to plasma formed from, e.g. $CF_4$ or $CHF_3$, in accordance with well known techniques. The photoresist layer 5 is then stripped to provide the structure shown in FIG. 2.

After patterning the layer 4, the exposed boron nitride film 3 is exposed to a plasma formed from a mixture of an oxygen-containing gas and a small amount of a fluorine-containing gas, in accordance with the process of the present invention. Preferably, the oxygen-containing gas is oxygen, CO or $CO_2$, with oxygen being the most preferred; while the fluorine-containing gas is a fluorocarbon, e.g. $CF_4$ or $CHF_3$, $SF_6$ or $NF_3$, where $CF_4$ is particularly preferred.

Generally speaking, a predominant amount of the oxygen-containing gas is employed, and the fluorine-containing gas is used in an amount ranging from about 1 to about 30 percent by volume of the mixture. It has been found that by increasing the proportion of fluorine-containing gas in the mixture, higher etch rates of the boron nitride film 3 can be obtained. However, at the same time, it has also been found that the etch becomes less selective to the boron nitride film 3. That is, at higher proportions of the fluorine-containing gas, the etch rate of an overlying or underlying layer of silicon dioxide or silicon nitride will also increase, resulting in a loss of selectivity. Specifically then, to maximize the boron nitride etch rate while also providing high selectivity, it is more preferred to employ the fluorine-containing gas in an amount ranging from about 5 to about 15 percent by volume of the mixture.

The etch is continued until the desired amount of the boron nitride film 3 has been removed. Generally, the pattern is transferred to the boron nitride film 3, without appreciable etching of the underlying layer 2, to produce the structure as shown in FIG. 3. Also, the etch produces anisotropic profiles, without significant undercutting of the boron nitride film 3 beneath the overlying layer 4.

The following examples are provided to further illustrate the invention.

EXAMPLE 1

Blanket films of boron nitride, silicon doped boron nitride, silicon nitride and silicon dioxide were formed on silicon substrates. The boron nitride and silicon doped boron nitride films were formed by plasma enhanced chemical vapor deposition (PECVD), using an AME 5072 SWE (Applied Materials Etcher 5072, Single Wafer Etcher; available from Applied Materials, Inc. Santa Clara, Calif.), under the following conditions:

|  | BN | SiBN |
|---|---|---|
| Pressure (Torr) | 4.4 | 4.4 |
| Temperature (°C.) | 400 | 400 |
| Power (W) | 360 | 360 |
| Electrode Spacing (Mils) | 395 | 395 |
| Gas Flows (sccm) | | |
| $SiH_4$ | 0 | 5 |
| $NH_3$ | 50 | 50 |
| $N_2$ | 1500 | 1500 |
| $B_2H_6$ (1% in $N_2$) | 1000 | 1000 |

The silicon nitride films were formed by low pressure chemical vapor deposition (LPCVD), using a conventional LPCVD system, under the following conditions:

| Pressure (MTorr) | 150 |
|---|---|
| Temperature (°C.) | 770 +/− 10 |
| Gas Flows (sccm) | |
| $SiCl_2H_2$ | 13.0 |
| $NH_3$ | 130 |
| $N_2$ | 200 |

The silicon dioxide films were thermally grown at 1000° C. and 1 atm pressure in HCl/O₂ ambient (HCl, 19 sccm, and O₂, 232 sccm).

The blanket films were then etched, using an AME 5072 SWE, under the following conditions:

| | |
|---|---|
| Time (sec) | 60 |
| Pressure (mTorr) | 80 |
| Cathode Temp. (°C.) | 20 |
| Power (W) | 400 |
| Magnetic Field (G) | 20 |
| Gas Flows (sccm): | |
| O₂ | (varied) |
| CF₄ | (varied) |
| Total | 20 |

The etch rates of the films were as follows:

| | ETCH RATE (Å/min) | | | |
|---|---|---|---|---|
| | SiBN | BN | LPCVD Si₃N₄ | THERMAL SiO₂ |
| 90% CF₄/O₂ | 2382 | 2126 | 1829 | 1502 |
| 70% CF₄/O₂ | 2828 | 2503 | 2317 | 1446 |
| 30% CF₄/O₂ | 2477 | 2063 | 1127 | 720 |
| 15% CF₄/O₂ | 934 | 921 | 263 | 74 |
| 10% CF₄/O₂ | 617 | 632 | 46 | 52 |

Figure 4:
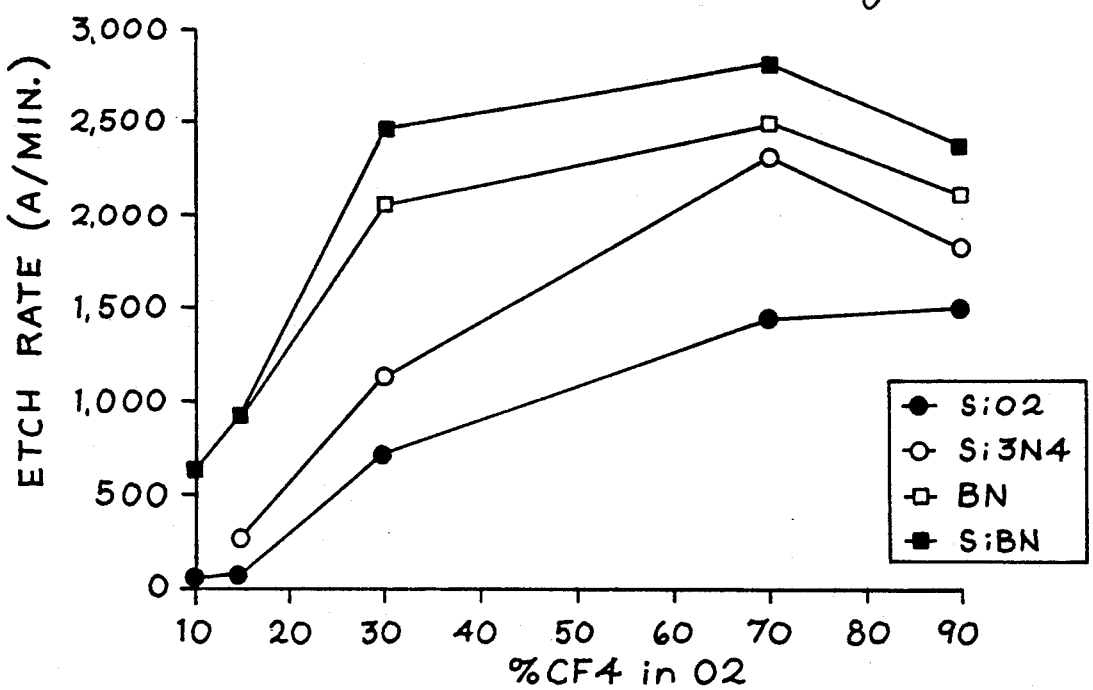
FIG. 4 shows the rates at which silicon nitride, silicon dioxide, boron nitride and silicon doped boron nitride disposed on a silicon substrate are etched, using the etching process of the present invention.

The etch rates for the blanket films are also shown in FIG. 4. As shown, the etch rates for the boron nitride and silicon doped boron nitride films generally increase with increasing proportions of CF₄. However, the rates of increase are greatest between about 10-30% CF₄ (by volume). Greater selectivity to the boron nitride and silicon doped boron nitride films is also shown at lower proportions of CF₄, i.e. at less than about 30% CF₄. Selectivities of greater than 10/1 are shown at 10 and 15% CF₄, as compared with the silicon dioxide films, i.e. 632/52 and 921/74, respectively.

EXAMPLE 2

Blanket films of boron nitride, silicon doped boron nitride, silicon nitride and silicon dioxide were formed on silicon substrates, as in Example 1. These films were then etched, as in Example 1, except that he etch time varied and the plasma was formed form a mixture of 10% CF₄/O₂. The etch rates of the films were as follows:

| | ETCH RATE (Å/min) | | | |
|---|---|---|---|---|
| ETCH TIME (sec) | SiBN | BN | LPCVD Si₃N₄ | THERMAL SiO₂ |
| 30* | 892 | 741 | 81 | 34 |
| 60 | 617 | 632 | 46 | 52 |
| 120 | 734 | 578 | 43 | 44 |
| 360 | 545 | 617 | 34 | 42 |

*Etch rates may not be real due to induction time.

Figure 5:
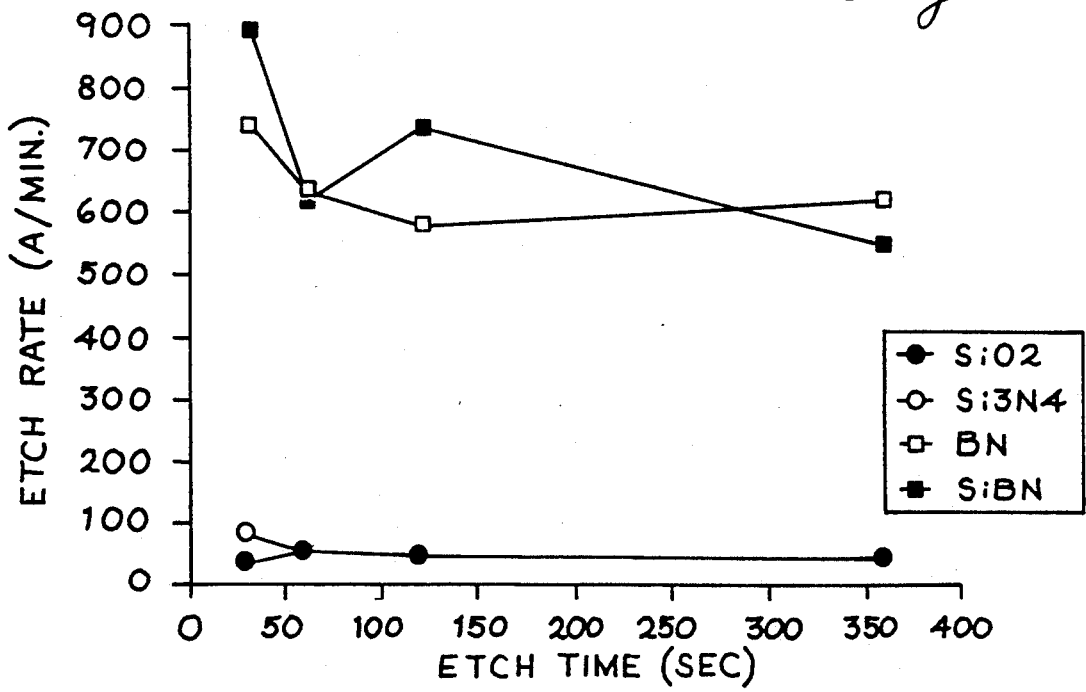
FIG. 5 shows the rates at which silicon nitride, silicon dioxide, boron nitride and silicon doped boron nitride disposed on a silicon substrate are etched, using the etching process of the present invention, including a plasma formed from a mixture of 10% $CF_4/O_2$.

The etch rates for the blanket films are also shown in FIG. 5. As shown, the etch was highly selective; selectivities generally greater than 10/1, or in some cases greater than 20/1, as compared with the silicon dioxide and silicon nitride films, were obtained.

EXAMPLE 3

The following procedure was carried out to etch silicon doped boron nitride films masked with a layer of silicon nitride:

A film of silicon doped boron nitride was formed on a P- silicon wafer, as in Example 1, to a thickness of 8000 Å. A layer of silicon nitride was then formed on the film by LPCVD as in Example 1, to a thickness of 2000 Å. Next, a layer of photoresist was spin applied to the silicon nitride layer to a thickness of 0.6μ, and exposed and developed to form a desired pattern. After etching the silicon nitride using a plasma formed from CF₄, the remaining photoresist was stripped. The pattern was then transferred to the silicon doped boron nitride film, using the etch conditions of Example 1 and a plasma formed from a mixture of 10% CF₄/O₂.

Figure 6A:
FIGS. 6A and 6B illustrate the anisotropic profiles which result from etching a film of boron nitride with an overlying masking layer of silicon nitride, using the etching process of the present invention.
Figure 6B:
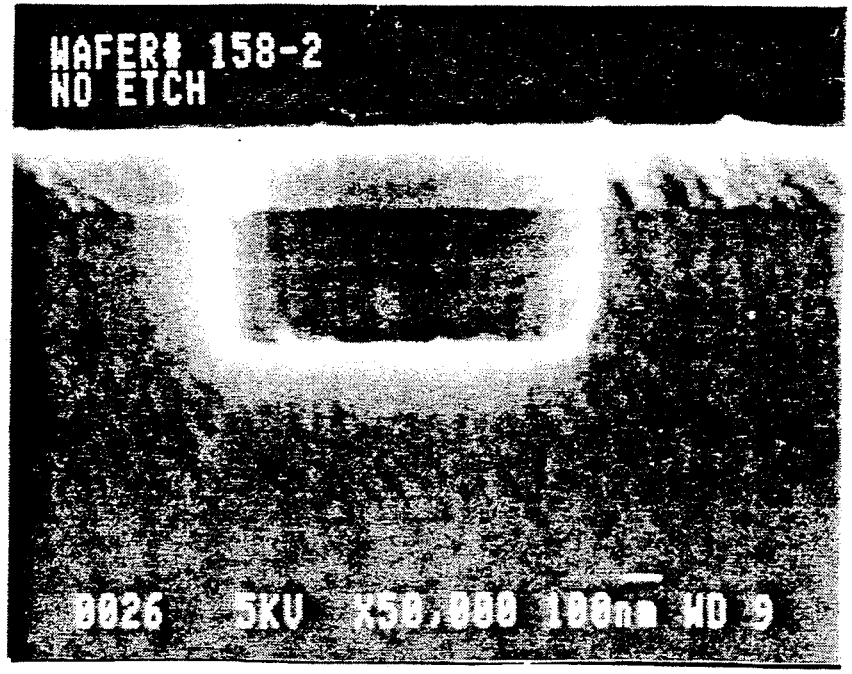

The results showed an etch rate of silicon doped boron nitride of 3052 Å/min, with a high selectivity with respect to the LPCVD silicon nitride. Also, vertical side walls were obtained, with good etch uniformity. The etch profiles are shown in FIGS. 6A and 6B.

It should also be apparent to those skilled int he art that various modifications can be made without departing form the spirit and scope of the invention. For example, the actual etch conditions may vary over wide ranges, such as the following preferred conditions:

| | Range |
|---|---|
| Time (sec) | 10–3600 |
| Pressure (mTorr) | 0.1–2000 |
| Cathode Temp. (°C.) | −70–200 |
| Power (W) | 100–1000 |
| | (about 0.55–5.5 W/cm²) |
| Magnetic Field (G) | 0–160 |

Also, the thicknesses of the boron nitride films and the overlying and/or underlying layers may depend on many factors, depending upon the particular application. For example, thicknesses of 50-2000 Å and 10-5000 Å for the boron nitride films and the layers, respectively, would be typical. In any event, a rapid etch of boron nitride, with high selectivity to silicon nitride and/or silicon dioxide, demonstrating anisotropic profiles and good uniformity, is achieved.

We claim:

1. A process etching a film comprising boron nitride with high selectivity to a layer comprising silicon dioxide or silicon nitride, said process comprising exposing said film to a plasma formed from a mixture of an oxygen-containing gas and a small amount of a fluorine-containing gas.

2. The process of claim 1, wherein said oxygen-containing gas is selected from oxygen, CO and CO₂.

3. The process of claim 2, wherein said oxygen-containing gas is oxygen.

4. The process of claim 1, wherein said fluorine-containing gas is selected from CF₄, CHF₃, SF₆ and NF₃.

5. The process of claim 4, wherein said fluorine-containing gas is CF₄.

6. The process of claim 1, wherein said fluorine-containing gas is employed in an amount ranging from about 1 to about 30 percent by volume of said mixture.

7. The process of claim 6, wherein said fluorine-containing gas is employed in an amount ranging from about 10 to about 15 percent by volume of said mixture.

8. The process of claim 1, wherein said film comprises undoped boron nitride, silicon doped boron nitride or carbon doped boron nitride.

9. The process of claim 8, wherein said film is etched with high selectivity to a masking layer comprising silicon nitride.

10. A process for fabricating a semiconductor device, comprising: providing a processed semiconductor substrate having a film comprising boron nitride formed thereon, and a masking layer comprising silicon dioxide or silicon nitride formed on said film, and exposing said substrate to a plasma formed from a mixture of an oxygen-containing gas and a small amount of a fluorine-containing gas, so as to etch said film at a higher rate than said layer, and terminating said exposing step when a predetermined portion of said film has been removed.

11. The process of claim 10, wherein said oxygen-containing gas is selected from oxygen, CO and $CO_2$ and said fluorine-containing gas is selected from $CF_4$, $CHF_3$, $SF_6$ and $NF_3$.

12. The process of claim 11, wherein said oxygen-containing gas is oxygen and said fluorine-containing gas is $CF_4$; and $CF_4$ is employed in an amount ranging from about 1 to about 30 percent by volume of said mixture.

13. The process of claim 12, wherein $CF_4$ is employed in an amount ranging from about 10 to about 15 percent by volume of said mixture.

14. The process of claim 13, wherein said film comprises undoped boron nitride, silicon doped boron nitride or carbon doped boron nitride; and said masking layer comprises silicon nitride.

15. The process of claim 14, wherein said substrate is exposed to a plasma at a pressure of about 0.1-2000 mTorr and a power of about 0.55-5.5 watts/$cm^2$.

* * * * *